United States Patent
Tramet et al.

(10) Patent No.: US 10,405,464 B2
(45) Date of Patent: Sep. 3, 2019

(54) ELECTRONIC POWER MODULE, ELECTRONIC ARCHITECTURE COMPRISING SAME, VOLTAGE CONVERTER AND ELECTRIC MACHINE COMPRISING SAME

(71) Applicant: Valeo Systemes de Controle Moteur, Cergy-Pontoise (FR)

(72) Inventors: Guillaume Tramet, Montesson (FR); Arnaud Mas, Cergy (FR); Ernesto Sacco, Cergy (FR)

(73) Assignee: Valeo Systemes de Controle Moteur, Cergy-Pontoise (FR)

( * ) Notice: Subject to any disclaimer, the term of this patent is extended or adjusted under 35 U.S.C. 154(b) by 347 days.

(21) Appl. No.: 15/363,315

(22) Filed: Nov. 29, 2016

(65) Prior Publication Data
US 2017/0164508 A1  Jun. 8, 2017

(30) Foreign Application Priority Data

Dec. 2, 2015  (FR) .................................... 15 61739

(51) Int. Cl.
| H05K 7/20 | (2006.01) |
|---|---|
| H02K 5/00 | (2006.01) |
| H05K 1/02 | (2006.01) |
| H05K 7/14 | (2006.01) |
| H02K 11/33 | (2016.01) |
| H02K 5/08 | (2006.01) |
| H01L 23/34 | (2006.01) |
| H05K 1/18 | (2006.01) |
| H05K 3/20 | (2006.01) |

(52) U.S. Cl.
CPC .............. *H05K 7/209* (2013.01); *H02K 5/00* (2013.01); *H02K 11/33* (2016.01); *H05K 1/0265* (2013.01); *H05K 7/14* (2013.01); *H05K 7/1432* (2013.01); *H01L 23/34* (2013.01); *H02K 5/08* (2013.01); *H05K 1/0203* (2013.01); *H05K 1/181* (2013.01); *H05K 3/202* (2013.01); *H05K 2201/09118* (2013.01); *H05K 2201/10272* (2013.01); *H05K 2203/049* (2013.01)

(58) Field of Classification Search
CPC ........................................................ H02K 5/08
USPC ........................................ 310/68 R, 71, 68 D
See application file for complete search history.

(56) References Cited

U.S. PATENT DOCUMENTS

| 2008/0211331 A1* | 9/2008 | Dubuc ................. H02K 11/048 310/71 |
|---|---|---|
| 2014/0021814 A1* | 1/2014 | Seidenbinder ....... H02K 11/048 310/71 |
| 2014/0265743 A1* | 9/2014 | Chamberlin ............. H02K 9/19 310/68 D |

FOREIGN PATENT DOCUMENTS

| EP | 2525634 A1 | 11/2012 |
|---|---|---|
| FR | 2967846 A1 | 5/2012 |
| FR | 3020727 A1 | 11/2015 |

OTHER PUBLICATIONS

Preliminary Search Report issued in corresponding French Patent Application No. 1561739, dated Aug. 17, 2016 (2 pages).

\* cited by examiner

*Primary Examiner* — Gary A Nash

(74) *Attorney, Agent, or Firm* — Osha Liang LLP

(57) ABSTRACT

An electronic power module may be integrated into a voltage converter. Additionally, the electronic power module may include a plane substrate with at least one power trace overmolded at least in part with electrically insulating material. Further, the plane substrate may have an upper face (Continued)

to receive at least one electronic component so as to be connected electrically to the at least one power trace.

12 Claims, 4 Drawing Sheets

ELECTRONIC POWER MODULE, ELECTRONIC ARCHITECTURE COMPRISING SAME, VOLTAGE CONVERTER AND ELECTRIC MACHINE COMPRISING SAME

BACKGROUND

The subject of the invention is an electronic power module, notably intended to be integrated into a voltage converter and an assembly of such an electronic power module and of an electronic power module support.

The invention also relates to an electronic architecture comprising such an assembly and a voltage converter intended to be integrated into an electric machine. Another subject of the invention relates to an electric machine comprising such a voltage converter.

Usually, an electronic power module, intended to supply an electric machine, requires a box allowing electrical insulation of the electronic module and electrical connection of the electronic power module to electrical elements of the electric machine. Such electronic modules generally require specific production lines, and consequently have high production costs.

The present invention is aimed at remedying these drawbacks by proposing a compact electronic power module manufactured on standard manufacturing lines, such as the production lines used for the production of electronic modules by "DBC" (Direct Bounded Copper) technology.

SUMMARY OF DISCLOSURE

For this purpose, the subject of the invention is an electronic power module, notably intended to be integrated into a voltage converter, the said voltage converter being notably intended to be integrated into an electric machine, the electronic power module comprising a plane substrate comprising at least one power trace overmoulded at least in part with electrically insulating material, and an upper face intended to receive at least one electronic component so as to be connected electrically to the at least one power trace.

Advantageously, the electronic power module according to the invention can be manufactured on standard production lines, using methods such as silk-screen printing, the deposition of surface mounted components ("SMC"), or refusion, which are used for the production of electronic modules by "DBC" technology, thereby reducing the production costs of such an electronic module. Furthermore, such an electronic power module allows a simplification of the assembling and manufacturing methods.

The electronic power module according to the invention can also comprise one or more of the following characteristics, considered individually or according to all the possible combinations:
  the plane substrate is devoid of lateral walls extending from the plane substrate substantially perpendicularly to the upper face of the plane substrate;
  the plane substrate comprises an upper part comprising the at least one power trace and a lower part comprising at least one open cavity, the bottom of the open cavity being formed at least in part by at least one portion of the at least one power trace;
  the lower part and the upper part of the plane substrate are formed with continuity of substance.

The invention also pertains to an assembly of an electronic power module and of an electronic power module support, notably intended to be integrated into a voltage converter, comprising:
  an electronic power module according to the invention, the electronic module comprising a lower part comprising at least one open cavity; and
  an electronic power module support comprising a reception cavity for receiving the electronic power module, the reception cavity comprising a bottom from which there extends in a substantially perpendicular manner at least one protuberance of the support; and
in which the or each open cavity of the electronic power module is intended to receive at least one protuberance.

Advantageously, the assembly according to the invention allows efficient thermal dissipation of the heat generated by the electronic power module, and consequently makes it possible to decrease the wear of the components of the electronic power module.

The assembly according to the invention can also comprise one or more of the following characteristics, considered individually or according to all the possible combinations:
  the bottom of the or each open cavity of the electronic module is formed at least in part by at least one portion of the at least one power trace;
  the electronic power module is supported mechanically by the at least one protuberance;
  the reception cavity is intended to receive an insulating material, so that the electronic power module is embedded in the insulating material.

The subject of the invention is also an electronic architecture, notably intended to be integrated into a voltage converter, comprising a plurality of electronic power modules and a support common to the electronic power modules so that each electronic power module and the support forms an assembly according to the invention.

Advantageously, the electronic architecture according to the invention allows efficient thermal dissipation of the heat generated by the plurality of electronic power modules, and thus an increase in the lifetime of the components of the electronic power modules.

Furthermore, a plurality of electronic power modules associated with a common support allows a reduction in production costs and time.

The invention also pertains to a voltage converter notably intended to supply an electric machine, comprising at least one electronic architecture according to the invention or an assembly according to the invention.

According to one embodiment of the invention, the voltage converter can comprise a thermal dissipator forming the support of the electronic power module or modules.

The invention also relates to an electric machine for automotive vehicle comprising at least one voltage converter according to the invention integrated with the said electric machine. For example, the electric machine is a starter, a starter-alternator or another electric machine onboard the vehicle.

BRIEF DESCRIPTION OF DRAWINGS

Other characteristics and advantages of the present invention will become apparent on reading the description and from the following figures.

It should be noted that these drawings have no other aim than to illustrate the text of the description and do not in any way constitute a limitation of the scope of the invention.

In the various figures, analogous elements are designated by identical references.

DETAILED DESCRIPTION

Figure 1:
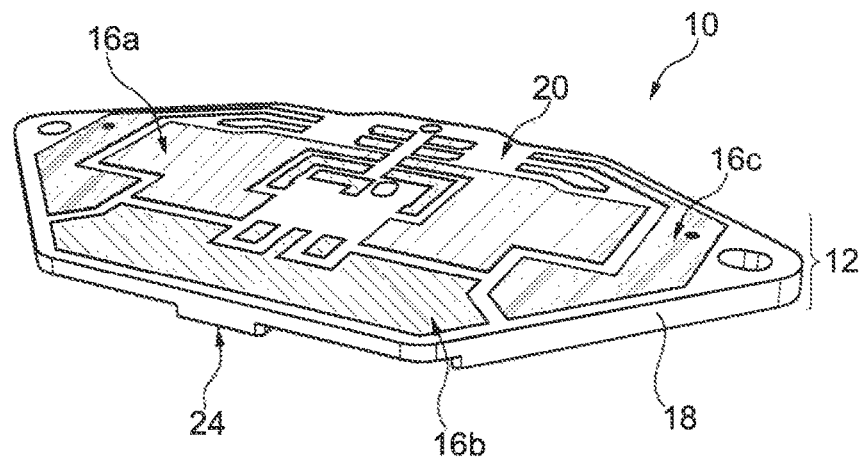
FIG. 1 represents a view of an upper face of a plane substrate of an electronic power module according to an embodiment of the invention.
Figure 2:
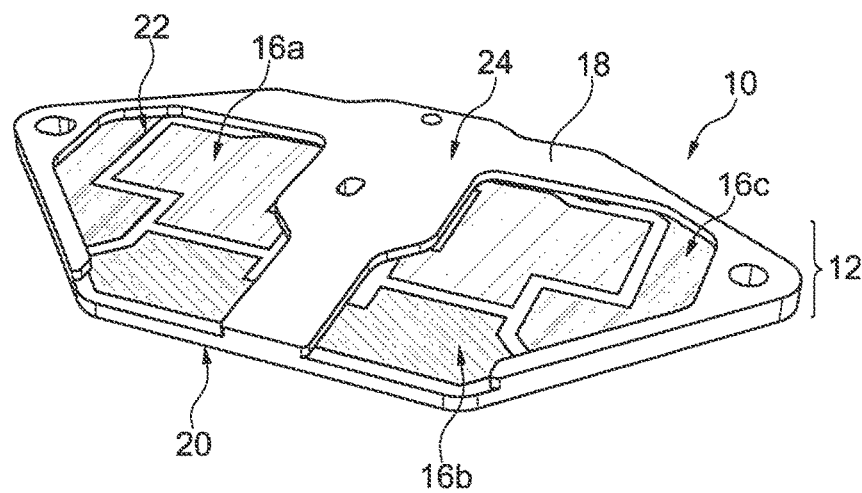
FIG. 2 represents a view of a lower face of the plane substrate of the electronic power module of FIG. 1 according to an embodiment of the invention.

The invention pertains to an electronic power module, notably intended to be integrated into a voltage converter. The voltage converter is notably intended to transmit an electric current from an electrical energy source to the electric machine into which it is integrated. In particular, FIGS. 1 and 2 represent respectively an upper face 20 and a lower face 24 of a plane substrate 12 of an electronic power module 10 according to the invention.

The electronic power module 10 comprises a plane substrate 12, the plane substrate 12 comprising at least one power trace overmoulded at least in part with electrically insulating material, preferably with plastic. In particular, in FIG. 1, the plane substrate 12 of the electronic power module comprises three power traces 16a, 16b, 16c overmoulded at least in part with electrically insulating material. A power trace is an electrically conducting trace, notably metallic, for example a copper track. A power trace is notably configured to support an electric current intended to flow in the electric machine.

Each power trace 16a, 16b, 16c comprises at least one portion devoid of overmoulding, notably intended to be connected electrically to electrical elements outside the electronic power module 10 such as specified subsequently.

The thickness of the plane substrate 12 can be for example between 0.5 mm and 5 mm, and depends, in general on the thickness of the power traces. For example, the thickness of the power traces can be between 600 microns and 2000 microns.

Preferably, the plane substrate 12 is devoid of lateral walls extending from the plane substrate 12 and notably from the upper face 20 of the plane substrate 12. Advantageously, this allows simultaneous insulation of a plurality of electronic modules disposed on a common support, but also a simplification of the manufacturing method, notably for refusion, as well as a saving of room within the voltage converter.

According to a preferred embodiment, the plane substrate 12 comprises an upper part 70 and a lower part 72, which are advantageously formed with continuity of substance. In particular, the upper part 70, notably visible in FIG. 1, comprises at least one power trace, and the lower part 72, notably visible in FIG. 2, comprises at least one open cavity 22. The bottom of the open cavity 22 is preferably formed at least in part by at least one portion of a power trace. The overmoulding 18 of the power traces 16a, 16b, 16c forms at least in part the edge of the open cavities 22. In particular, as represented in FIG. 2, the electronic power module 10 comprises two open cavities 22. The open cavities allow thermal dissipation notably, and will be detailed subsequently.

Figure 3:
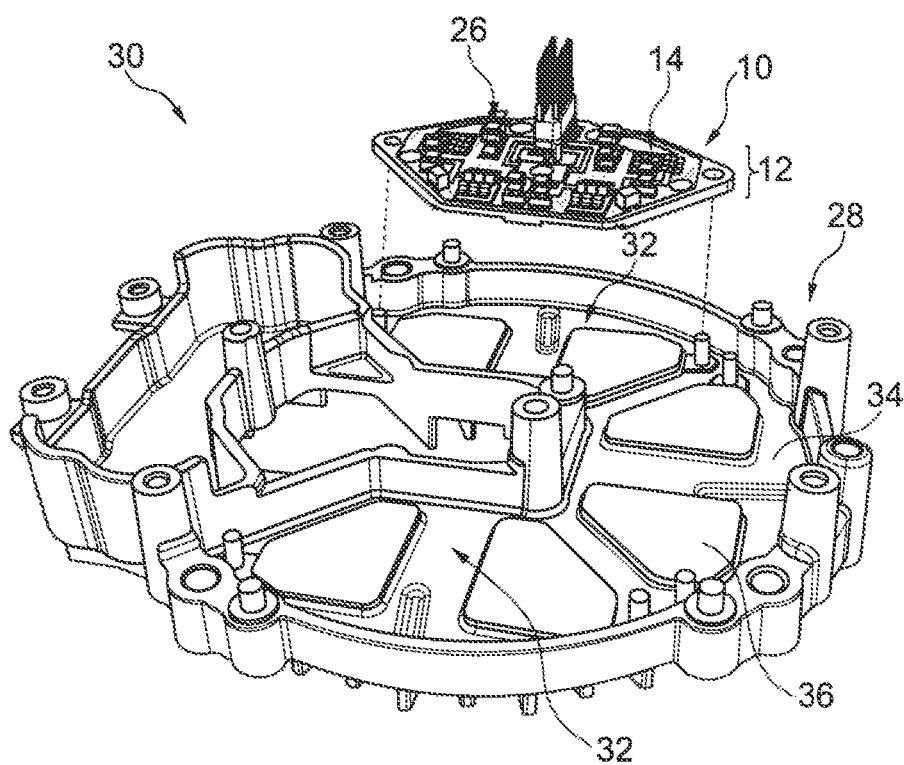
FIG. 3 represents an exploded view according to an embodiment of an assembly of an electronic power module and of an electronic module support according to the invention.

As represented in FIG. 3, the electronic power module 10 comprises at least one electronic component 14, arranged on the upper face 20 of the plane substrate 12, so as to be connected electrically to one of the power traces.

The electronic power module 10 can also comprise at least one exterior connection element 26, disposed on the same face of the plane substrate 12 as the electronic component 14. The exterior connection element 26 can comprise a conducting material tab bent into the shape of a "Z" so as to comprise at least a lower plane face in contact with the plane substrate 12 and an upper plane face intended to electrically connect a power trace to at least one electrical element outside the electronic power module 10. For example, an exterior connection element 26 can be intended to electrically connect the first power trace 16a to a phase (φ) of the electric machine, or the second power trace 16b to a positive polarity pole (B+) of an electrical energy source, or the third power trace 16c to a negative polarity pole (B−) or to the earth of an electrical energy source.

Preferably, the mounting of the exterior connection elements 26 and of the electronic components 14 on the plane substrate 12 is achieved by depositing solder paste and then by disposing the electronic components 14 and the exterior connection elements 26 on the surface of the plane substrate 12 of the electronic power module ("SMC"). The electrically insulating material of the plane substrate 12 of the electronic module 10 is advantageously made of high temperature plastic, so as not to be impaired when passing the electronic module 10 to the oven for the refusion of the components. Such a method of fabricating the electronic modules makes it possible to decrease the number of links between the components of the electronic module 10, notably the electronic components 14 and the exterior connection elements 26, and thus to simplify the method for fabricating and assembling the electronic modules. Moreover, the mounting of the electronic components 14 and of the exterior connection elements 26 directly on the plane substrate allows a saving of room within the voltage converter.

In particular, the electronic components 14 and/or the exterior connection elements 26 are mounted on a power trace 16a, 16b, 16c. Notably, electrical contact is made with the power trace 16a, 16b, 16c through the face of the electronic component 14 or of the connection element 26 which is in contact with the power trace 16a, 16b, 16c. Furthermore, the electronic component 14 can be in electrical contact with other electronic components 14, or another power trace than that on which it is mounted, notably by connection wires (also called "bonding").

Figure 4:
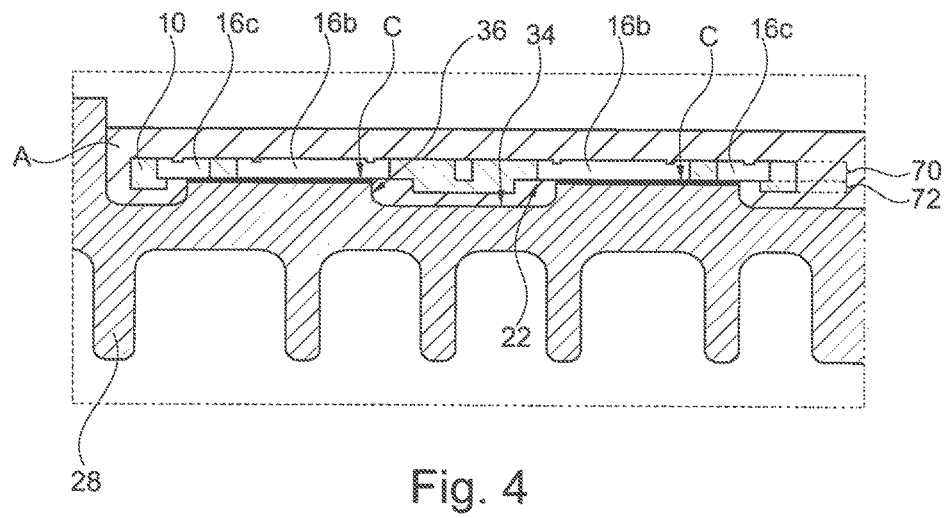
FIG. 4 represents a view in cross-section of an assembly of an electronic power module and of an electronic module support according to an embodiment of the invention.

The electronic power module such as described above is intended to be received by an electronic module support 28. In particular, an assembly 30 of an electronic power module 10 and of an electronic module support 28 according to the invention is represented in FIGS. 3 and 4. The assembly 30 is notably intended to be integrated into a voltage converter.

The electronic power module support 28 comprises a reception cavity 32 for receiving the electronic power module 10. In particular, as illustrated in FIG. 3, the power module support 28 comprises three reception cavities 32, each reception cavity 32 being intended to receive an electronic power module 10.

The support 28 allows thermal and electrical conduction, notably for earth pickup and heat dissipation. The reception cavity comprises a bottom 34 from which there extends in a substantially perpendicular manner at least one protuberance 36 of the support 28. The or each open cavity 22 of the electronic power module 10 is intended to receive at least one protuberance 36.

The or each protuberance 36 is intended to be covered with a thermally conducting and electrically insulating material C, notably visible in FIG. 4. For example, the thermally conducting material C is advantageously a thermal grease.

The bottom of each open cavity 22 of the electronic module 10 is formed at least in part by a portion of a power trace. For example, as illustrated in FIG. 4, the bottom of each open cavity 22 is formed by two portions of power traces 16b, 16c and by an overmoulding portion. Of course, the bottom of the open cavities 22 can be formed by a single or a plurality of power traces or portions of power traces. Moreover, the bottom of each cavity 22 is in contact with the or each protuberance 36. In particular, as visible in FIG. 4, the electronic power module 10 is supported mechanically by the at least one protuberance 36. Stated otherwise, the electronic power module 10 is intended to bear on the protuberances 36 of the support 28. A space between the electronic power module 10 and the bottom 34 of the reception cavity 30 of the support 28, visible in FIG. 4, results therefrom for the electrical and thermal insulation of the electronic power module 10.

Advantageously, the reception cavity 32 of the support 28 is intended to be filled with an insulating material A, notably visible in FIG. 4, so that the electronic power module 10 is embedded in the insulating material A. The insulating material can be an insulating gel, for example a silicone gel, or an insulating resin, for example an epoxy resin.

In particular, this configuration allows efficient insulation of the electronic modules 10. Advantageously, the power module support 28 is a heat dissipator, also called a thermal dissipator. The power modules 10 are fixed to the thermal dissipator so as to allow thermal transfer between the power modules 10 and a cooling circuit (not represented), so as to dissipate the heat generated by the electronic modules 10.

Preferably, as illustrated in FIG. 4, an end of the exterior connection element 26 intended to electrically connect a power trace to at least one electrical element outside the electronic power module 10 protrudes from the layer of insulating material A covering the electronic component 14.

Advantageously, the electronic component 14 is covered by a layer of insulating material A. In particular, the layer of insulating material covering the electronic component 14 has an upper thickness of at least 1 mm at an end of the electronic component 14 opposite to an end of the electronic component 14 in contact with the plane substrate 12.

Furthermore, the reception cavity 32 for the electronic modules 10 can comprise positioning elements (not represented) intended to position the electronic modules 10 on the support 28 in a predetermined position. These positioning elements make it possible to facilitate and guarantee correct and fast positioning of the electronic modules 10 on the support 28.

A plurality of electronic power modules 10 and a support 28 common to the electronic power modules 10 such as were described above are notably intended to be integrated into a voltage converter.

Figure 5:
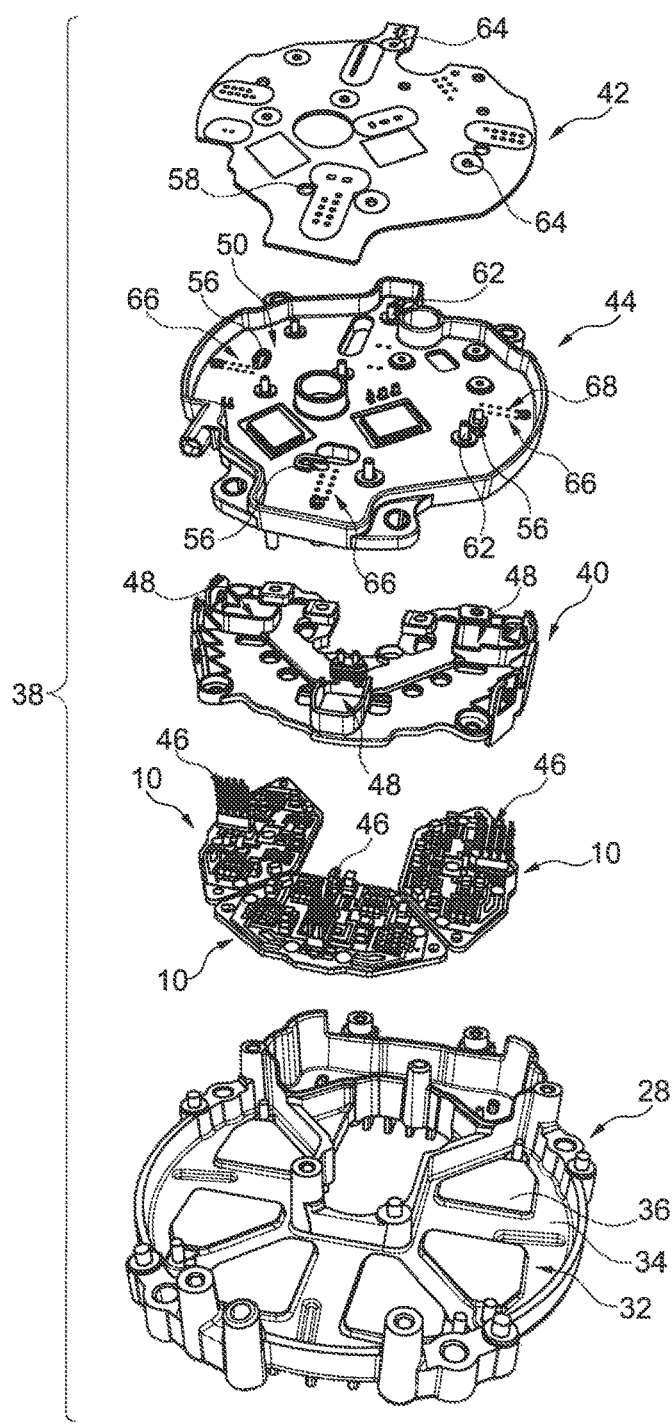
FIG. 5 is an exploded view according to an embodiment of a voltage converter according to the invention.

In particular, FIG. 5 represents an exploded view of such a voltage converter 38, intended to be integrated into an electric machine, comprising an electronic architecture, that is to say electronic power modules 10, in this example three in number, and a support 28 of the electronic modules such as were described above. The voltage converter 38 preferably comprises a thermal dissipater forming the support of the electfonic power modules.

The voltage converter 38 can also comprise an electrical connector 40, an electronic control board 42, and an electronic board support 44.

Advantageously, the voltage converter 38 is an AC/DC converter. Preferably, the voltage converter 38 is integrated into the casing of the electric machine, notably by positioning the support 28 on an end of the casing of the electric machine.

The electronic control board 42 is notably intended to control the electronic power modules 10. In particular, the electronic board 42 is intended to be connected electrically with the electronic power modules 10 via at least one electrical connection element 46.

The electrical connector 40 is arranged between the support 28 of the electronic power modules and the support 44 of the electronic board. The electrical connector 40 is configured to electrically connect the electronic modules 10 to at least one of the electrical elements (phase φ), of the electric machine and/or to at least one of the electrical elements (B$^+$, B$^-$) of an electrical energy source. The electrical elements of the electric machine are, for example, phases φ. The electrical elements of the electrical energy source are for example a positive DC terminal B$^+$, a negative DC terminal B$^-$ or the earth. There is preferably an electronic power module 10 per phase φ. Furthermore, as represented in FIG. 5, the electrical connector 40 comprises orifices 48 designed to permit access of the electrical connection elements 46 of the electronic modules 10 to the electronic control board 42.

The support 44 of the electronic control board is arranged between the electronic power modules 10 and the electronic control board 42. The support 44 of the electronic control board is preferably made of insulating substance, for example moulded from plastic. The support 44 comprises an open cavity 50 having a bottom on which the electronic board 42 is intended to be received.

Figure 6:
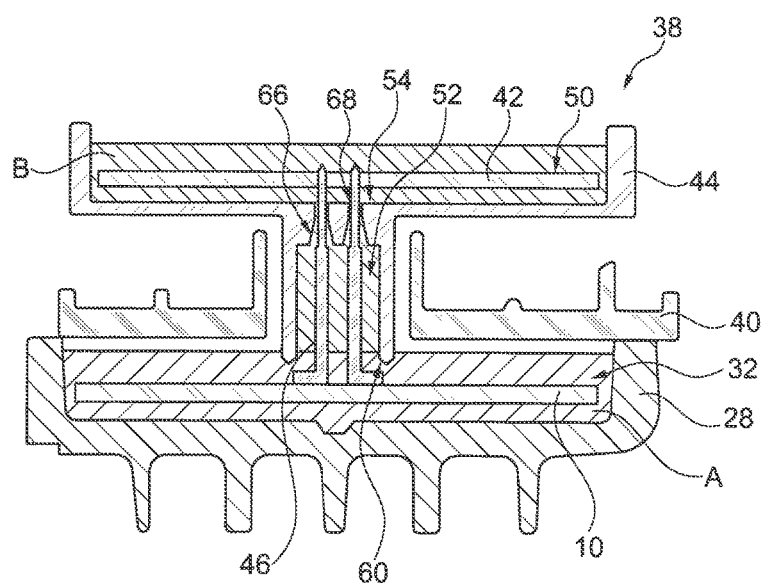
FIG. 6 represents a sectional view according to an embodiment of an assembled voltage converter of FIG. 4 according to the invention.

The support 44 also comprises at least one hollow column 52 into which the at least one electrical connection element 46 of the electronic board 42 with the electronic modules 10 is intended to be inserted. The hollow column 52, notably visible in FIG. 6, extends from the open cavity 50 and is configured to communicate with the open cavity 50 at a first end 54 of the hollow column 52. In particular, the support 44 of the electronic board can comprise a plurality of hollow columns, each hollow column being intended to receive the electrical connection elements 46 of each electronic module 10 with the electronic control board 42. The open cavity 50 is intended to be filled with an insulating material so that the electronic control board 42 is embedded in the insulating material. For example, as represented in FIG. 6, the electronic board is embedded in an insulating material B. The electronic control board 42 is thus insulated in an efficient manner.

Advantageously, the electronic control board support 44 can comprise a filling element 56 for the hollow column 32. The filling element 56, also called a filling channel, can have a general ramp shape, preferentially a helical shape.

The electronic control board 42 can advantageously comprise an orifice 58 arranged opposite the end of the channel 56 communicating with the bottom of the open cavity 50. The orifice 58 of the electronic board 42 allows the filling of the hollow column 52 with insulating material B by way of the channel 56.

An end of the filling element 58 communicates with the bottom of the open cavity 50 and another end of the filling element 58 communicates with a lateral wall of the hollow column 52. Preferably, a second end 60 of the hollow column 52 is in contact with the insulating material in which the electronic module 10 is embedded. This configuration makes it possible to guarantee the filling of the hollow column 52 with insulating material, and thus to ensure efficient insulation of the electrical connection elements 46.

Preferably, as illustrated in FIG. 6, a second end 60 of the hollow column 52 is in contact with the insulating material A in which the electronic module 10 is embedded. This configuration makes it possible to guarantee the filling of the hollow column 52 with insulating material B, and thus to ensure efficient insulation to dust, to liquids, to gases or else to moisture of the electrical connection elements 46. The insulating material thus makes it possible to eliminate any risk of possible short-circuit at the level of the interconnection of the electronic board 42 with the electronic power modules 10.

In particular, the electronic control board 42 and the electronic power modules 10 can be insulated with identical or different insulating materials A, B, preferably an identical insulating material, notably an insulating gel.

The interface between the insulating material A of the electronic power module 10 and the insulating material B of the electronic control board 42 is notably situated inside the hollow column 52, in proximity to the second end 60 of the hollow column 52.

Furthermore, the space lying between the electronic board 42 and the power module 10 and surrounding the hollow column 52 is devoid of substance, notably of insulating material. The space free of substance, notably of insulating material, has, inter alia, the effect of leaving a space free for air circulation, thus allowing cooling by convection. Moreover, this configuration makes it possible to decrease the production costs of the voltage converter 36, by virtue notably of a saving in insulating material. This substance-free space receives at least in part the electrical connector 40.

Furthermore, the bottom of the open cavity 50 preferably comprises positioning elements 62 intended to position the electronic board 42 on the support 44 in a predetermined position. Stated otherwise, the positioning elements 62 disposed on the support 44 of the electronic board are intended to cooperate with complementary positioning elements 64 of the electronic board 42. For example, in FIG. 5, six positioning elements 62 are represented, each comprising a lug protruding from the bottom of the open cavity 50, in a manner perpendicular to the bottom. The positioning elements 62 can be of cylindrical shape as represented in FIG. 5. The six complementary positioning elements 64 of the electronic board are positioning orifices preferably exhibiting a cross-section whose shape and dimensions are complementary to the shape and dimensions of the positioning elements 62. For example, as illustrated in FIG. 5, the complementary positioning elements 64 exhibit a circular cross-section. These positioning elements 62 make it possible to position the electronic board 42 correctly and rapidly on the support 44, and thus to allow efficient electrical connection of the electronic board 42 with the electronic power modules 10.

Moreover, the bottom of the open cavity 50 advantageously comprises guidance elements 66 for guiding the at least one electrical connection element 46 arranged at the first end 54 of the hollow column 52 and intended to guide the at least one electrical connection element 46 towards the electronic board 42. For example, in FIG. 5, the bottom of the open cavity 50 comprises three groups of guidance elements 66. The guidance elements 66 comprise guidance orifices 68, advantageously a guidance orifice 68 per electrical connection element 46. The guidance orifices 68 make it possible to recentre the electrical connection elements 46 with a view to the electrical connection of the electronic module 10 with the electronic board 42 and thus to correctly connect the electronic module 10 with the electronic board 42. Preferably, in order to allow better recentring of the electrical connection elements 46, the cross-section of the guidance orifices 68 facing the electronic module 10 is larger than the cross-section of the guidance orifices 68 facing the electronic board 42. For example, in FIG. 6, the two guidance elements 66 exhibit a circular cross-section and comprise a frustoconical portion followed by a cylindrical portion.

The electronic power module has been described within the framework of a voltage converter intended to be integrated into an electric machine that it supplies. The electric machine is notably intended to be onboard an automotive vehicle to allow starting of a combustion engine of the vehicle and/or to produce electrical energy from the combustion engine of the vehicle. Notably, the voltage converter is attached onto a housing of the machine, for example by screwing into holes in the voltage converter. Of course, the invention is in no way limited to the embodiment described and illustrated, which has been given merely by way of example. On the contrary, other applications of the electronic power module in accordance with the invention are also possible without departing from the scope of the invention. In particular, the voltage converter could be independent of the electric machine, for example by being mounted on a support other than the electric machine.

What is claimed:

1. An electronic power module configured to be integrated into a voltage converter, the electronic power module comprising:
    a plane substrate comprising at least one power trace overmoulded at least in part with electrically insulating material; and
    an upper face for receiving at least one electronic component so as to be connected electrically to the at least one power trace,
    wherein said plane substrate comprises an upper part comprising the at least one power trace and a lower part comprising at least one open cavity, the bottom of the open cavity being formed at least in part by at least one portion of the at least one power trace.

2. The electronic power module according to claim 1, wherein the plane substrate is devoid of lateral walls extending from the plane substrate, notably from the upper face of the plane substrate.

3. The electronic power module according to claim 1, wherein the lower part and the upper part of the plane substrate are formed with continuity of substance.

4. An assembly, comprising:
    an electronic power module and an electronic power module support configured to be integrated into a voltage converter,
    wherein the electronic power module comprises:
        plane substrate comprising at least one power trace overmoulded at least in part with electrically insulating material,
        an upper face for receiving at least one electronic component so as to be connected electrically to the at least one power trace, and
        a lower part comprising at least one open cavity; and
    wherein the electronic power module support comprises:

a reception cavity for receiving the electronic power module, the reception cavity comprising a bottom from which there extends, in a substantially perpendicular manner, at least one protuberance of the support; and wherein the or each open cavity of the electronic power module is intended to receive at least one protuberance.

5. The assembly according to claim 4, wherein the bottom of the or each open cavity of the electronic module is formed at least in part by at least one portion of the at least one power trace.

6. The assembly according to claim 4, wherein the electronic power module is supported mechanically by the at least one protuberance.

7. The assembly according to claim 4, wherein the reception cavity is intended to receive an insulating material, so that the electronic power module is embedded in the insulating material.

8. An electronic architecture configured to be integrated into a voltage converter, comprising:

a plurality of electronic power modules and a support common to the electronic power modules so that each electronic power module and the support forms an assembly according to claim 4.

9. A voltage converter for supplying an electric machine, comprising at least one electronic architecture according to claim 8.

10. A voltage converter according to claim 9, comprising a thermal dissipator forming the support of the electronic power module or modules.

11. An electric machine for motor vehicle comprising at least one voltage converter according to claim 9 integrated with the said electric machine.

12. A voltage converter for supplying an electric machine, comprising an assembly according to claim 4.

* * * * *